US011013149B2

(12) United States Patent
Kim et al.

(10) Patent No.: US 11,013,149 B2
(45) Date of Patent: May 18, 2021

(54) ELECTRONIC DEVICE INCLUDING HEAT DISSIPATION STRUCTURE

(71) Applicant: Samsung Electronics Co., Ltd., Suwon-si (KR)

(72) Inventors: Yonghwa Kim, Suwon-si (KR); Dongil Son, Suwon-si (KR); Chihwei Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/810,144

(22) Filed: Mar. 5, 2020

(65) Prior Publication Data
US 2020/0367386 A1  Nov. 19, 2020

(30) Foreign Application Priority Data

May 15, 2019 (KR) .................. 10-2019-0056849

(51) Int. Cl.
*H05K 7/20* (2006.01)
*H05K 5/00* (2006.01)
*H01Q 1/00* (2006.01)
*H04M 1/02* (2006.01)

(52) U.S. Cl.
CPC ......... *H05K 7/20436* (2013.01); *H01Q 1/002* (2013.01); *H05K 5/0004* (2013.01); *H05K 5/0017* (2013.01); *H05K 7/2099* (2013.01); *H05K 7/20336* (2013.01); *H05K 7/20963* (2013.01); *H04M 1/0202* (2013.01)

(58) Field of Classification Search
None
See application file for complete search history.

(56) References Cited

U.S. PATENT DOCUMENTS 7,129,908 B2 * 10/2006 Edward .................... H01Q 1/02
343/878
8,422,232 B2 * 4/2013 Kwak ...................... H01Q 1/42
361/710
9,582,051 B2 * 2/2017 Jang ...................... G06F 1/1626
(Continued)

FOREIGN PATENT DOCUMENTS

WO  2018/123119 A1  7/2018

OTHER PUBLICATIONS

International Search Report dated Jun. 11, 2020, issued in International Application No. PCT/KR2020/003002.

*Primary Examiner* — Courtney L Smith
(74) *Attorney, Agent, or Firm* — Jefferson IP Law, LLP

(57) ABSTRACT

An electronic device is provided. The electronic device includes a housing including a front plate, a rear plate facing away from the front plate, and a side structure surrounding a space between the front plate and the rear plate, a heat dissipation member accommodated inside the housing, at least one antenna module disposed adjacent to the side structure or at least partially accommodated in the side structure, the at least one antenna module being disposed to be inclined or perpendicular relative to the front plate or the rear plate, and a fixing member coupled to and at least partially surrounding the antenna module. The fixing member may include a first heat transfer portion at least partially surrounding a rear face of the antenna module, and a second heat transfer portion disposed in contact with the heat dissipation member.

19 Claims, 15 Drawing Sheets

(56) References Cited

U.S. PATENT DOCUMENTS

| | | | |
|---|---|---|---|
| 9,730,363 B2 * | 8/2017 | Kawano | H05K 7/20445 |
| 9,787,809 B2 * | 10/2017 | Jeong | H04M 1/0277 |
| 2012/0155015 A1 * | 6/2012 | Govindasamy | H01L 23/36 |
| | | | 361/679.46 |
| 2013/0000865 A1 | 1/2013 | Shi | |
| 2014/0069611 A1 | 3/2014 | Liu et al. | |
| 2016/0248145 A1 | 8/2016 | Ritter et al. | |
| 2016/0248893 A1 | 8/2016 | Kim | |
| 2018/0035528 A1 * | 2/2018 | Kim | G06F 1/203 |
| 2018/0288908 A1 | 10/2018 | Lee et al. | |
| 2018/0309185 A1 | 10/2018 | Akiyama et al. | |
| 2018/0331445 A1 | 11/2018 | Gieski et al. | |
| 2019/0051967 A1 | 2/2019 | Ryu et al. | |
| 2019/0235586 A1 | 8/2019 | Tani et al. | |
| 2020/0194879 A1 * | 6/2020 | Lim | H01Q 1/243 |

* cited by examiner

ELECTRONIC DEVICE INCLUDING HEAT DISSIPATION STRUCTURE

CROSS-REFERENCE TO RELATED APPLICATION(S)

This application is based on and claims priority under 35 U.S.C. § 119(a) of a Korean patent application number 10-2019-0056849, filed on May 15, 2019, in the Korean Intellectual Property Office, the disclosure of which is incorporated by reference herein in its entirety.

BACKGROUND

1. Field

The disclosure relates to an electronic device. More particularly, the disclosure relates to an electronic device including a heat dissipation structure.

2. Description of Related Art

As electronic, information, and communication technologies have developed, various functions have come to be integrated into a single electronic device. For example, a smart phone includes functions of an audio reproduction device, an imaging device, or a digital diary, in addition to a communication function, and a greater variety of functions may be implemented in the smart phone through installation of additional applications. An electronic device may be provided with various pieces of information in real time by accessing a server or another electronic device in a wired or wireless manner as well as by executing an installed application or a stored file.

As the degree of integration of electronic devices increases, electronic devices are capable of performing various functions while being miniaturized. As the degree of integration of electronic devices increases, electronic components (e.g., processors or communication modules) that perform various signal processing and control in electronic devices or electronic components (e.g., antenna modules) that perform wireless communication may be further miniaturized, highly integrated, and advanced. For example, as various electronic components are integrated and advanced, electronic devices may exhibit high performance while being further miniaturized.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device in which a stable operation environment is ensured.

Such electronic components or electronic devices are capable of exhibiting stable operating performance in an appropriate temperature environment. However, integrated advanced electronic components may generate heat while operating, and self-heating may degrade operating performance. Degradation of operating performance due to heat generation may lead to power efficiency reduction for the same signal-processing or control operation. In an electronic device used in the state of being carried or worn, the heat generated by the electronic components may cause low-temperature burns. In an electronic device, such as a desktop computer or a laptop computer, mechanical devices, such as a cooling fan may be used to quickly cool the internal space of the electronic device or self-heating electronic components. However, it may be difficult to mount such a cooling device in the electronic device used in the state of being carried or worn.

One aspect of the disclosure is to provide an electronic device having stable power efficiency.

Another aspect of the disclosure is to provide an electronic device in which the risk of low-temperature burns is mitigated or prevented.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a front plate, a rear plate facing away from the front plate, and a side structure surrounding a space between the front plate and the rear plate, a heat dissipation member accommodated inside the housing, at least one antenna module disposed adjacent to the side structure or at least partially accommodated in the side structure, the at least one antenna module being disposed to be inclined or perpendicular relative to the front plate or the rear plate, and a fixing member coupled to and at least partially surrounding the at least one antenna module. The fixing member may include a first heat transfer portion at least partially surrounding a rear face of the at least one antenna module, and a second heat transfer portion disposed in contact with the heat dissipation member, the second heat transfer portion being configured to transfer heat from the first heat transfer portion to the heat dissipation member.

In accordance with another aspect of the disclosure, an electronic device is provided. The electronic device includes a housing, a display device mounted on one face of the housing, at least one antenna module accommodated inside the housing, the at least one antenna module being configured to transmit/receive a wireless signal by forming a beam in a direction inclined or perpendicular relative to the direction in which a screen is output from the display, a fixing member coupled to and at least partially surrounding the at least one antenna module, and a heat dissipation member accommodated inside the housing. The fixing member may include a first heat transfer portion at least partially surrounding the rear face of the at least one antenna module, and a second heat transfer portion disposed in contact with the heat dissipation member, the second heat transfer portion being configured to transfer heat from the first heat transfer portion to the heat dissipation member.

In accordance with another aspect of the disclosure, at least a self-heating electronic component (e.g., an antenna module) transfers heat to a heat dissipation member through a fixing member made of a thermally conductive material, thereby dispersing or releasing the heat generated by the electronic component itself. For example, the electronic device is capable of ensuring a stable operating environment by preventing heat from being concentrated on an electronic component that generates heat. According to various embodiments of the disclosure, by mitigating or preventing the temperature increase of a self-heating electronic component, it is possible to improve power efficiency in the operation of the electronic component or the electronic device and to prevent a user from being exposed to the risk of low-temperature burns.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
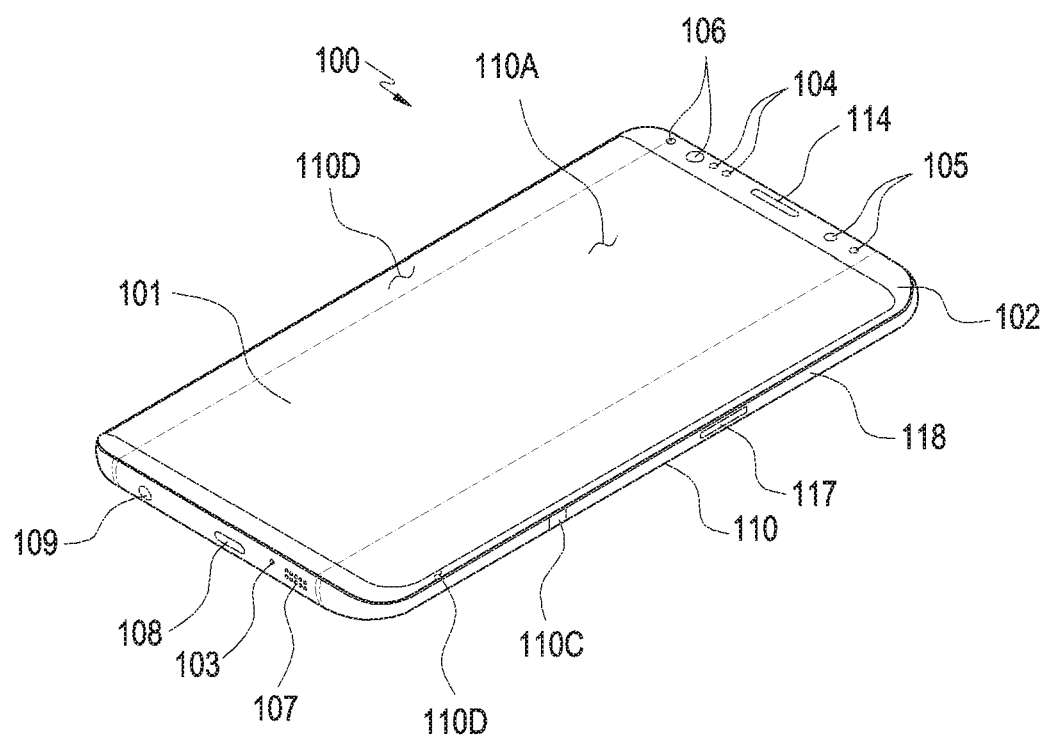
FIG. 1 is a perspective view illustrating a front side of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

FIG. 1 is a perspective illustrating a front side of an electronic device according to an embodiment of the disclosure.

Figure 2:
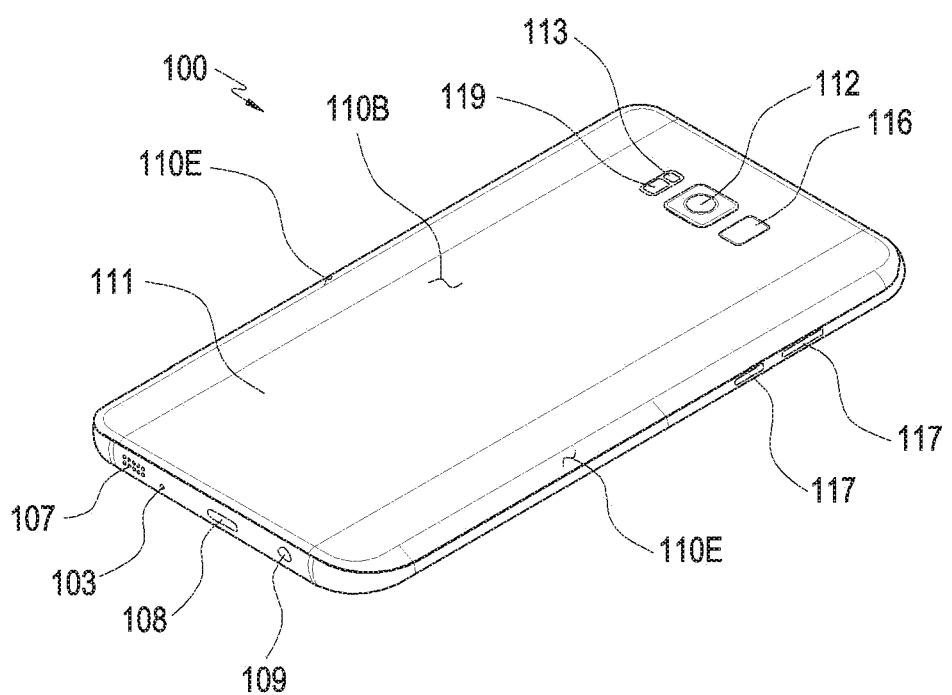
FIG. 2 is a perspective view illustrating a rear side of an electronic device according to an embodiment of the disclosure.

FIG. 2 is a perspective view illustrating a rear side of an electronic device according to an embodiment of the disclosure.

Referring to FIGS. 1 and 2, an electronic device 100 according to various embodiments may include a housing 110 including a first face (or a front face) 110A, a second face (or a rear face) 110B, and a side face 110C surrounding the space between the first face 110A and the second face 110B. In another embodiment (not illustrated), the term "housing" may mean a structure forming some of the first face 110A, the second face 110B, and the side face 110C of FIG. 1. According to an embodiment of the disclosure, at least a portion of the first face 110A may be formed by a substantially transparent front plate 102 (e.g., a glass plate or a polymer plate including various coating layers). The second face 110B may be formed by a substantially opaque rear plate 111. The rear plate 111 may be formed of, for example, coated or colored glass, ceramic, polymer, or metal (e.g., aluminum, stainless steel (STS), or magnesium), or a combination of two or more of these materials. The side face 110C may be formed by a side structure (or a "side member") 118 coupled to the front plate 102 and the rear plate 111 and including metal and/or polymer. In some embodiments of the disclosure, the rear plate 111 and the side structure 118 may be integrally formed, and may include the same material (e.g., a metal material, such as aluminum).

In an embodiment of the disclosure, the front plate 102 may include two first areas 110D, which are bent from the first face 110A toward the rear plate 111 and extend seamlessly, at the long opposite side edges thereof. In the illustrated embodiment (see FIG. 2), the rear plate 111 may include, at the long opposite side edges thereof, two second areas 110E, which are bent from the second face 110B toward the front plate 102 and extend seamlessly. In some embodiments of the disclosure, the front plate 102 (or the rear plate 111) may include only one of the first areas 110D (or the second areas 110E). In an embodiment of the disclosure, some of the first areas 110D or the second areas 110E may not be included. In the above-described embodiments of the disclosure, when viewed from a side of the electronic device 100, the side structure 118 may have a first thickness (or width) on the side faces, which do not include the first areas 110D or the second areas 110E, and may have a second thickness (or width), which is smaller than the first thickness, on the side faces, which include the first areas 110D or the second areas 110E.

According to an embodiment of the disclosure, the electronic device 100 may include at least one of a display 101, audio modules 103, 107, and 114, sensor modules 104, 116, and 119, camera modules 105, 112, and 113, key input devices 117, light-emitting elements 106, and connector holes 108 and 109. In some embodiments of the disclosure, in the electronic device 100, at least one of the components (e.g., the key input devices 117 or the light-emitting elements 116) may be omitted, or other components may be additionally included.

The display 101 may be exposed through, for example, a large portion of the front plate 102. In some embodiments of the disclosure, at least a part of the display 101 may be exposed through the front plate 102 forming the first face 110A and the first areas 110D of the side faces 110C. In some embodiments of the disclosure, the edges of the display 101 may be formed to be substantially the same as the shape of the periphery of the front plate 102 adjacent thereto. In another embodiment (not illustrated), the distance between the periphery of the display 101 and the periphery of the front plate 102 may be substantially constant in order to enlarge the exposed area of the display 101.

In another embodiment (not illustrated), a recess or an opening may be formed in a part of a screen display area of the display 101, and at least one of an audio module 114, a sensor module 104, a camera module 105, and a light-emitting element 106, which are aligned with the recess or the opening, may be included. In another embodiment (not illustrated), at least one of the audio module 114, the sensor module 104, the camera module 105, the fingerprint sensor 116, and the light-emitting element 106 may be included in the rear face of the screen display area of the display 101. In another embodiment (not illustrated), the display 101 may be coupled to or disposed adjacent to a touch-sensitive circuit, a pressure sensor that is capable of measuring the intensity (pressure) of touch, and/or a digitizer that detects a magnetic-field-type stylus pen. In some embodiments of the disclosure, at least some of the sensor modules 104 and 119 and/or at least some of the key input devices 117 may be disposed in the first areas 110D and/or the second areas 110E.

The audio modules 103, 107, and 114 may include a microphone hole 103 and speaker holes 107 and 114. The microphone hole 103 may include a microphone disposed therein so as to acquire external sound, and in some embodiments of the disclosure, multiple microphones may be disposed therein so as to detect the direction of sound. The speaker holes 107 and 114 may include an external speaker hole 107 and a phone call receiver hole 114. In some embodiments of the disclosure, the speaker holes 107 and 114 and the microphone hole 103 may be implemented as a single hole, or a speaker may be included therein without the speaker holes 107 and 114 (e.g., a piezo speaker).

The sensor modules 104, 116, and 119 may generate electrical signals or data values corresponding to the internal operating state or the external environmental state of the electronic device 100. The sensor modules 104, 116, and 119 may include, for example, a first sensor module 104 (e.g., a proximity sensor) and/or a second sensor module (not illustrated) (e.g., a fingerprint sensor) disposed on the first face 110A of the housing 110, and/or a third sensor module 119 (e.g., an heart rate monitor (HRM) sensor) and/or a fourth sensor module 116 (e.g., a fingerprint sensor) disposed on the second face 110B of the housing 110. The fingerprint sensor may be disposed not only on the front face 110A of the housing 110 (e.g., the display 101), but also on the second face 110B thereof. The electronic device 100 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112, and 113 may include a first camera device 105 disposed on the first face 110A of the electronic device 100 and a second camera device 112 disposed on the second face 110B thereof, and/or a flash 113. The camera modules 105 and 112 may include one or more lenses, an image sensor, and/or an image signal processor. The flash 113 may include, for example, a light-emitting diode or a xenon lamp. In some embodiments of the disclosure, two or more lenses (e.g., an infrared camera lens, a wide-angle lens, and a telephoto lens) and image sensors may be disposed on one face of the electronic device 100.

The key input devices 117 may be disposed on the side faces 110C of the housing 110. In an embodiment of the disclosure, the electronic device 100 may not include some or all of the above-mentioned key input devices 117, and a key input device 117, which is not included in the electronic device 100, may be implemented in another form, such as that of a soft key or the like, on the display 101. In some embodiments of the disclosure, the key input devices may include a sensor module 116 disposed on the second face 110B of the housing 110.

The light-emitting element 106 may be disposed, for example, on the first face 110A of the housing 110. The light-emitting element 106 may provide, for example, the status information of the electronic device 100 in an optical form. In an embodiment of the disclosure, the light-emitting element 106 may provide a light source that is interlocked with, for example, the operation of the camera module 105. The light-emitting element 106 may include, for example, a light emitting diode (LED), an IR LED, and a xenon lamp.

The connector holes 108 and 109 may include a first connector hole 108 that is capable of accommodating a connector (e.g., a USB connector) for transmitting and receiving power and/or data to and from an external electronic device and/or a second connector hole 109 that is capable of accommodating a connector (e.g., an earphone jack) for transmitting and receiving an audio signal to and from an external electronic device.

Figure 3:
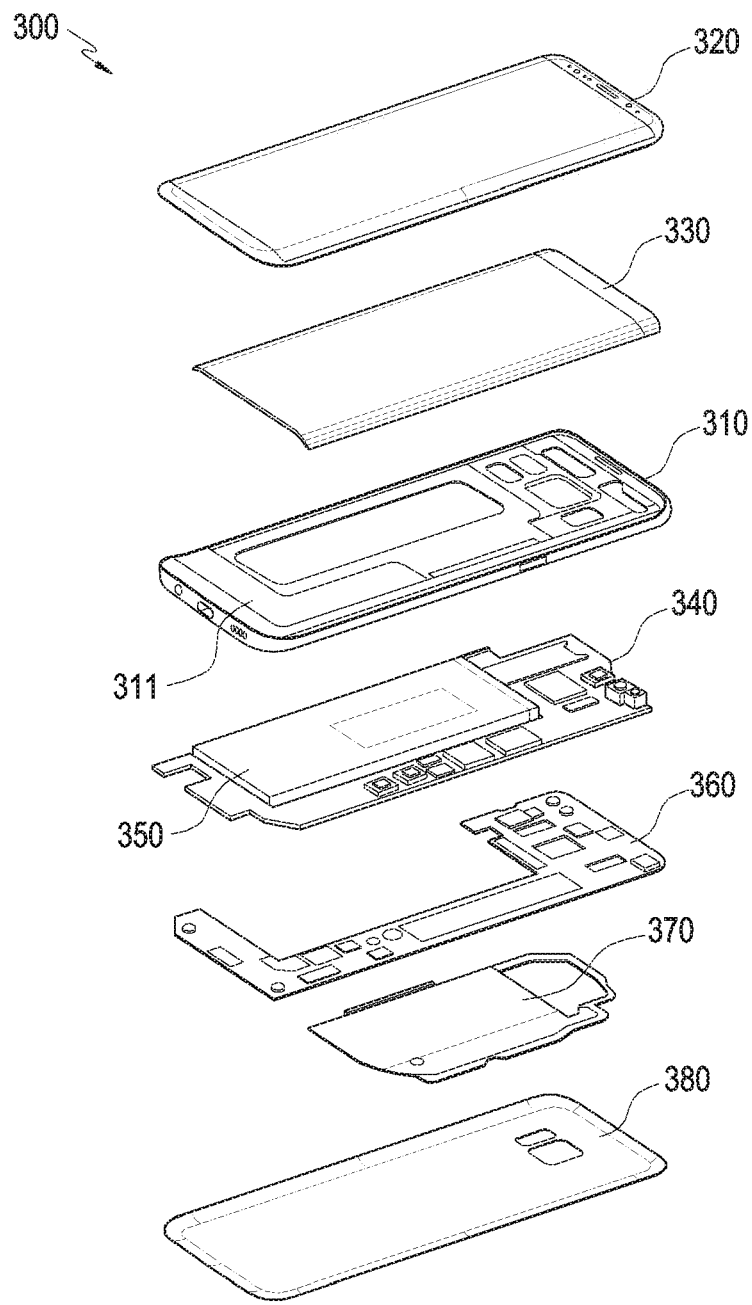
FIG. 3 is an exploded perspective view illustrating an electronic device according to an embodiment of the disclosure.

FIG. 3 is an exploded perspective view illustrating an electronic device according to an embodiment of the disclosure.

Referring to FIG. 3, an electronic device 300 may include a side structure 310, a first support member 311 (e.g., a bracket), a front plate 320, a display 330, a printed circuit board (PCB) 340, a battery 350, a second support member 360 (e.g., a rear case), an antenna 370, and a rear plate 380. In some embodiments of the disclosure, in the electronic device 300, at least one of the components (e.g., the support member 311 or the second support member 360) may be omitted, or other components may be additionally included. At least one of the components of the electronic device 300 may be the same as or similar to at least one of the components of the electronic device 300 of FIG. 1 or 2, and a redundant description thereof is omitted below.

The first support member 311 may be disposed inside the electronic device 300, and may be connected to the side structure 310 or may be formed integrally with the side structure 310. The first support member 311 may be formed of, for example, a metal material and/or a non-metal material (e.g., a polymer). The display 330 may be coupled to one face of the first support member 311, and the PCB 340 may be coupled to the other face of the first support member 311. On the PCB 340, a processor, memory, and/or an interface may be mounted. The processor may include at least one of, for example, a central processing unit, an application processor, a graphic processor, an image signal processor, a sensor hub processor, or a communication processor.

The memory may include, for example, volatile memory or nonvolatile memory.

The interface may include, for example, a high-definition multimedia interface (HDMI), a universal serial bus (USB) interface, a secure digital (SD) card interface, and/or an audio interface. The interface may electrically or physically connect, for example, the electronic device 300 to an external electronic device, and may include a USB connector, an SD card/multimedia card (MMC) connector, or an audio connector.

The battery 350 is a device for supplying power to at least one component of the electronic device 300, and may include, for example, a non-rechargeable primary battery, a rechargeable secondary battery, or a fuel cell. At least a portion of the battery 350 may be disposed so as to be substantially flush with, for example, the PCB 340. The battery 350 may be integrally disposed within the electronic device 300, or may be detachably mounted on the electronic device 300.

The antenna 370 may be disposed between the rear plate 380 and the display 350. The antenna 370 may include, for example, a near-field communication (NFC) antenna, a wireless charging antenna, and/or a magnetic secure transmission (MST) antenna. The antenna 370 may perform short-range communication with, for example, an external electronic device, or may transmit/receive power used for charging to/from the external device in a wireless manner. In an embodiment of the disclosure, an antenna structure may be formed by the side structure 310, a portion of the first support member 311, or a combination thereof.

Figure 4:
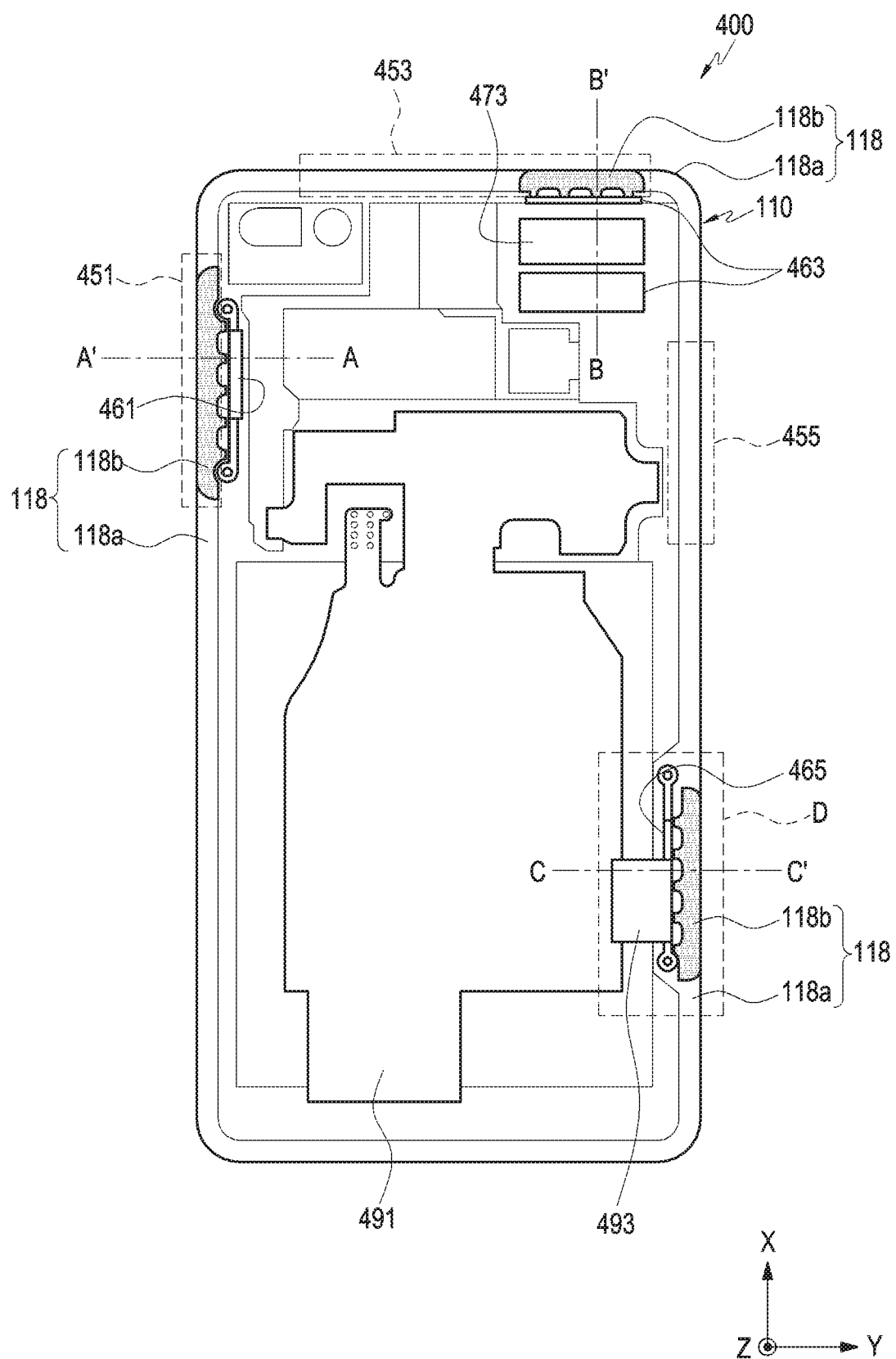
FIG. 4 is a view illustrating a configuration of an electronic device according to an embodiment of the disclosure.

FIG. 4 is a view illustrating a configuration of an electronic device according to an embodiment of the disclosure.

Figure 5:
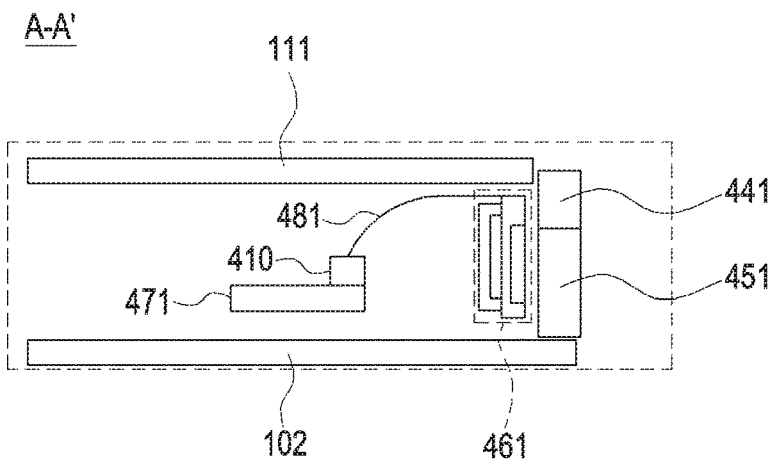
FIG. 5 is a cross-sectional view of an electronic device, taken along line A-A' in FIG. 4 according to an embodiment of the disclosure.

FIG. 5 is a cross-sectional view of an electronic device, taken along line A-A' in FIG. 4 according to an embodiment of the disclosure.

Figure 6:
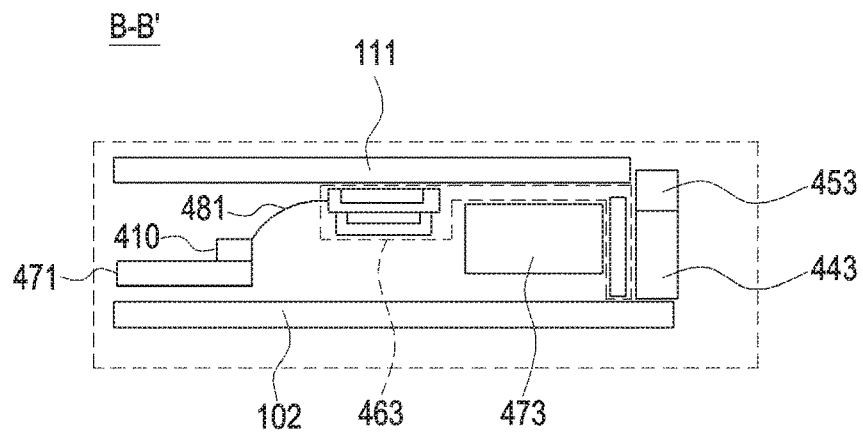
FIG. 6 is a cross-sectional view of an electronic device, taken along line B-B' in FIG. 4 according to an embodiment of the disclosure.

FIG. 6 is a cross-sectional view of an electronic device, taken along line B-B' in FIG. 4 according to an embodiment of the disclosure.

Figure 7:
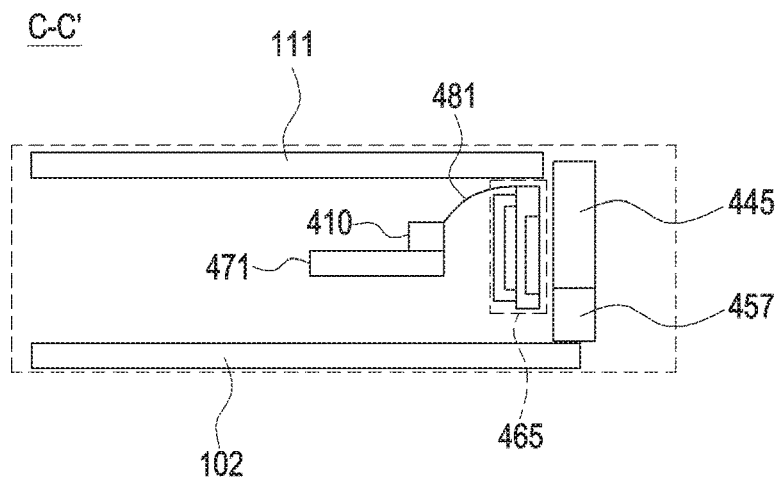
FIG. 7 is a cross-sectional view of an electronic device, taken along line C-C' in FIG. 4 according to an embodiment of the disclosure.

FIG. 7 is a cross-sectional view of an electronic device, taken along line C-C' in FIG. 4 according to an embodiment of the disclosure.

Referring to FIG. 4, an electronic device 400 may include a housing 110 including a first plate or a front plate (e.g., the front plate 102 in FIG. 1), a second plate or a rear plate (e.g., the rear plate 111 in FIG. 2) spaced apart from the first plate 102 and facing away from the first plate 481, and a side structure (e.g., the side structure 118 in FIG. 1) surrounding the space between the first plate 102 and the second plate 111. In an embodiment of the disclosure, the side structure 118 may include a conductive material portion 118a (e.g., first to third conductive material portions or legacy antennas 451, 453, 455, and 457 in FIGS. 5 to 7) or an electrically nonconductive material portion 118b (e.g., the first to third insulating portions 441, 443, and 445 in FIGS. 5 to 7).

According to various embodiments of the disclosure, the electronic device 400 may include a main PCB (e.g., a main PCB 471 in FIGS. 5 to 7) accommodated in a space between the first plate 102 and the second plate 111 and/or a midplate (e.g., the first or second support member 311 or 360 in FIG. 3), and may optionally further include various other components.

According to an embodiment of the disclosure, the electronic device 400 may include a first legacy antenna 451, a second legacy antenna 453, and/or a third legacy antenna 455 in the space between the first plate 102 and the second plate 111 and/or a portion of the housing 110 (e.g., the side structure 118). The first to third legacy antennas 451, 453, and 455 may be used for, for example, cellular communication (e.g., 2nd generation (2G), 3G, 4G, or long-term evolution (LTE)), near-field communication (e.g., Wi-Fi, Bluetooth, or NFC), and/or global navigation satellite system (GNSS).

According to various embodiments of the disclosure, the electronic device 400 may include a first antenna module 461, a second antenna module 463, and a third antenna module 465 for forming a directional beam. The antenna modules 461, 463, and 465 may be used for 5G network communication, mmWave communication, 60 GHz communication, or WiGig communication. The antenna modules 461, 463, and 465 may be disposed in the housing 110 to be spaced apart from a metal member of the electronic device 400 (e.g., the conductive material portion 118a of the side member 118), an internal component 473, and/or the first to third legacy antennas 451, 453, and 455 by a predetermined interval or more.

In an embodiment of the disclosure, the first antenna module 461 may be located at the upper end of the left side, the second antenna module 463 may be located at the upper end, and the third antenna module 465 may be located at the middle of the right side. In an embodiment of the disclosure, the electronic device 400 may include additional antenna modules at additional positions (e.g., at the middle of the lower end, or some of the first to third antenna modules 461, 463, and 465 may be omitted. According to an embodiment of the disclosure, the first to third antenna modules 461, 463, and 465 may be electrically connected to at least one communication processor 410 on a main PCB (e.g., a main PCB 471 in FIGS. 5 to 7) using a conductive line 481 (e.g., a coaxial cable or an FPCB in FIGS. 5 to 7).

Referring to FIG. 5, which is a cross-sectional view taken along line A-A' of FIG. 4, illustrating the configuration of an electronic device, the first antenna module 461 may include an antenna array (e.g., a patch antenna array or a dipole antenna array) that performs radiation toward the second plate 111 and another antenna array (e.g., a dipole antenna array or a patch antenna array) that performs radiation through the first insulating portion 441 (e.g., the nonconductive material portion 118b in FIG. 4).

Referring to FIG. 6, which is a cross-sectional view taken along line B-B' of FIG. 4, illustrating the configuration of an electronic device, the second antenna module 463 may include an antenna array (e.g., a patch antenna array or a dipole antenna array that performs radiation toward the second plate 111 and another antenna array (e.g., a dipole antenna array or a patch antenna array) that performs radiation through the second insulating portion 443 (e.g., the nonconductive material portion 118b in FIG. 4). According to an embodiment of the disclosure, another antenna array, for example, an antenna array performing radiation through the second insulating portion 443, may be omitted, and the second insulating portion 443 may be replaced with a conductive material. In an embodiment of the disclosure, the conductive material replacing the second insulating portion 443 may form a part of the legacy antenna 453.

Figure 10:
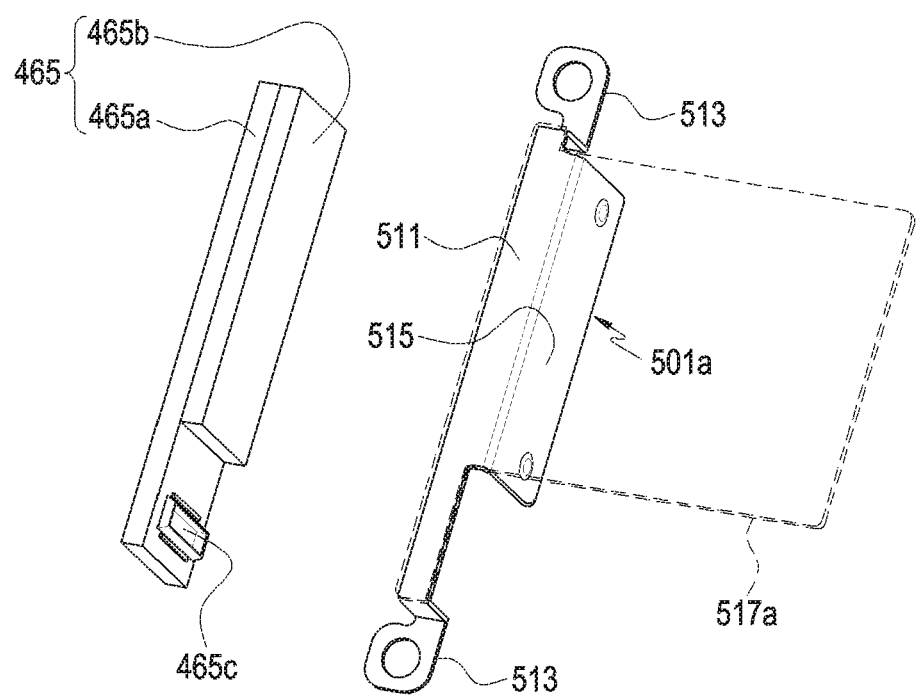
FIG. 10 is an exploded perspective view illustrating an antenna module or a fixing member of an electronic device according to an embodiment of the disclosure.

In an embodiment of the disclosure, the second antenna module 463 may include a plurality of PCBs (e.g., a substrate 465a in FIG. 10). For example, the second antenna module 463 may include antenna arrays, which are formed on different substrates, respectively. According to an embodiment of the disclosure, when the second antenna module 463 includes a plurality of PCBs, the PCBs may be connected through a flexible printed circuit board (FPCB). The FPCB may be disposed in the vicinity of electrical components (e.g., internal components 473, such as a receiver, a speaker, a sensor, a camera, an ear jack, or a button).

Referring to FIG. 7, which is a cross-sectional view taken along line C-C', illustrating the configuration of the electronic device, the third antenna module 465 may be disposed inside the housing 110 to face the side structure 118 (e.g., the side structure 118*i* in FIG. 4). The third antenna module 465 may include an antenna array (e.g., a dipole antenna array or a patch antenna array) that performs radiation toward the second plate 111 and another antenna array (e.g., a patch antenna array or a dipole antenna array) that performs radiation through the third insulating portion 445 (e.g., the nonconductive material portion 118*b* in FIG. 4).

Referring to FIG. 4 again, according to various embodiments of the disclosure, the electronic device 400 may further include a heat dissipation member 491. The heat dissipation member 491 may be disposed to be connected to or to come into direct contact with electronic components that generate heat during operation, such as an advanced integrated circuit chip, such as a processor or a communication module (e.g., a communication processor 410 in FIGS. 5 to 7), a power source device, such as a battery (e.g., the battery 350 in FIG. 3), or the antenna modules 461, 463, and 465. For example, the heat dissipation member 491 may diffuse the heat generated by electronic components to a wider area, or may dissipate the heat to another space in the vicinity thereof. The heat dissipation member 491 may include, for example, a graphite sheet, a vapor chamber, or a heat pipe, and at least a part of the heat dissipation member 491 may be disposed parallel to the first plate 102 or the second plate 111.

According to various embodiments of the disclosure, the electronic device 400 may further include a heat transfer member 493, thereby connecting the heat dissipation member 491 to the electronic component (e.g., the third antenna module 465). For example, a portion of the heat transfer member 493 may be attached to the third antenna module 465 side, and another portion of the heat transfer member 493 may be attached to the heat dissipation member 491. In an embodiment of the disclosure, the heat transfer member 493 may transfer the heat generated by the third antenna module 465 to the heat dissipation member 491. In an embodiment of the disclosure, although the heat transfer member 493 is illustrated as a separate component with respect to another structure, it is to be noted that the embodiment is not limited thereto. For example, the heat transfer member 493 may be a part of the heat dissipation member 491, and in an embodiment of the disclosure, the heat transfer member 493 may be a part of a fixing member (e.g., a fixing member 501*a* in FIG. 8 or 9) to be described later in another embodiment.

Hereinafter, the mounting structure or the heat dissipation structure of the antenna modules 461, 463, and 465 will be described with reference to FIGS. 8 and the like. A subsequent structure or a heat dissipation structure to be described below will be described with reference to a configuration provided in the third antenna module 465, and at least a part of the mounting structure of the third antenna module 465 may also be used in the structure for mounting the first antenna module 461 or the second antenna module 463. In the following detailed description, components that can be easily understood through the above-described embodiments may be denoted by the same reference numerals as in the above-described embodiments of the disclosure, or the reference numerals may be omitted, and the detailed descriptions thereof may also be omitted.

Figure 8:
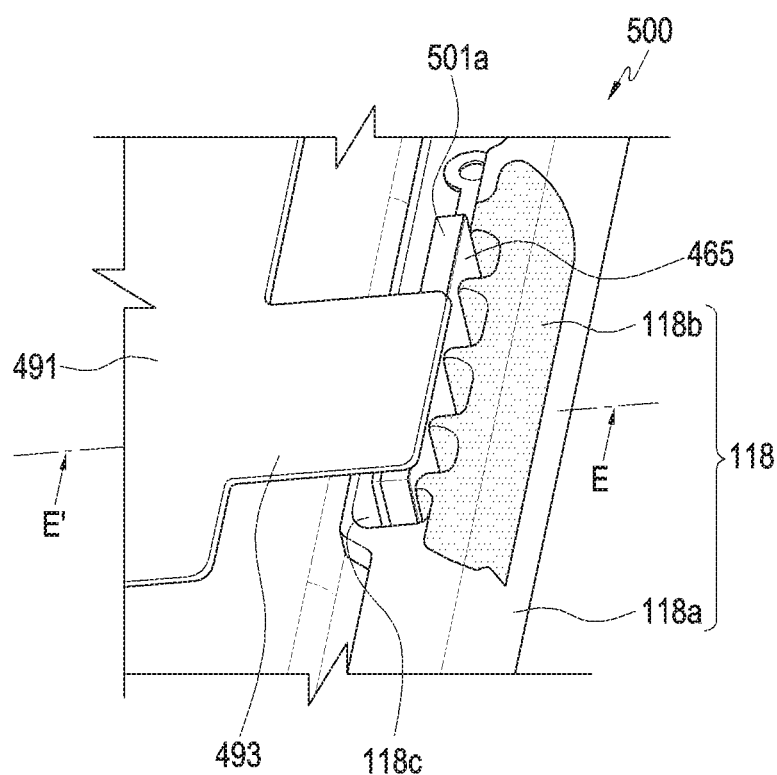
FIG. 8 is a perspective view illustrating a portion D of FIG. 4 on an enlarged scale according to an embodiment of the disclosure.

FIG. 8 is perspective a view illustrating a portion D of FIG. 4 on an enlarged scale according to an embodiment of the disclosure.

Figure 9:
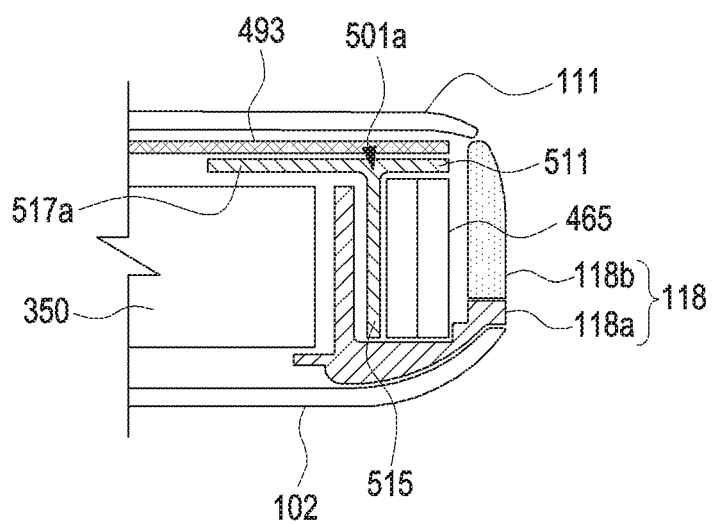
FIG. 9 is a cross-sectional view of an electronic device, taken along line E-E' in FIG. 8 according to an embodiment of the disclosure.

FIG. 9 is a cross-sectional view of an electronic device, taken along line E-E' in FIG. 8 according to an embodiment of the disclosure.

Referring to FIGS. 8 and 9, an electronic device (e.g., the electronic device 400 in FIG. 4) may include an antenna module (e.g., the third antenna module 465 in FIG. 4) or a fixing member 501*a*. In an embodiment of the disclosure, the antenna module 465 is for performing 5G wireless communication, mmWave communication, 60 GHz communication, or WiGig communication, and may be located adjacent to the side structure 118, or may be at least partially accommodated in the side structure 118. For example, the side structure 118 may include an accommodation hole 118*c*, and the accommodation hole 118*c* may be a space at least partially surrounded by a conductive material portion 118*a* or a nonconductive material portion 118*b*. In an embodiment of the disclosure, the antenna module 465 may be accommodated in the accommodation hole 118*c*, and may be disposed to be inclined with respect to the front plate 102 or the rear plate 111.

According to various embodiments of the disclosure, the wording "the antenna module is disposed to be inclined with respect to the front plate or the rear plate" may mean that one face of the antenna module 465 is oriented to be inclined or perpendicular relative to the direction in which the front plate 102 or the rear plate 111 faces. For example, the antenna module 465 may transmit/receive a wireless signal by forming a directional beam in a direction (e.g., the Y direction in FIG. 4) inclined or perpendicular relative to the direction in which the front plate 102 or the rear plate 111 faces. In some embodiments of the disclosure, when including both a patch antenna array and a dipole antenna array, the antenna module 465 may also form a directional beam in the direction (e.g., +Z direction or −Z direction in FIG. 4) in which the front plate 102 or the rear plate 111 faces. When forming the directional beam in the Y direction in FIG. 4, the antenna module 465 may transmit/receive a wireless signal via the nonconductive material portion 118*b* (e.g., the third insulating portion 445 in FIG. 7).

According to various embodiments of the disclosure, the fixing member 501*a* may be coupled to and may at least partially surround the antenna module 465, and may be bound to the side structure 118 so as to fix the antenna module 465. For example, the antenna module 465 may be fixed to the side structure 118, or may be fixed in the accommodation hole 118*c* by the fixing member 501*a*. Various embodiments of the antenna module 465 and the fixing member 501*a* will be described with reference to FIGS. 10 to 12.

FIG. 10 is an exploded perspective view illustrating an antenna module or a fixing member of an electronic device according to an embodiment of the disclosure.

Figure 11:
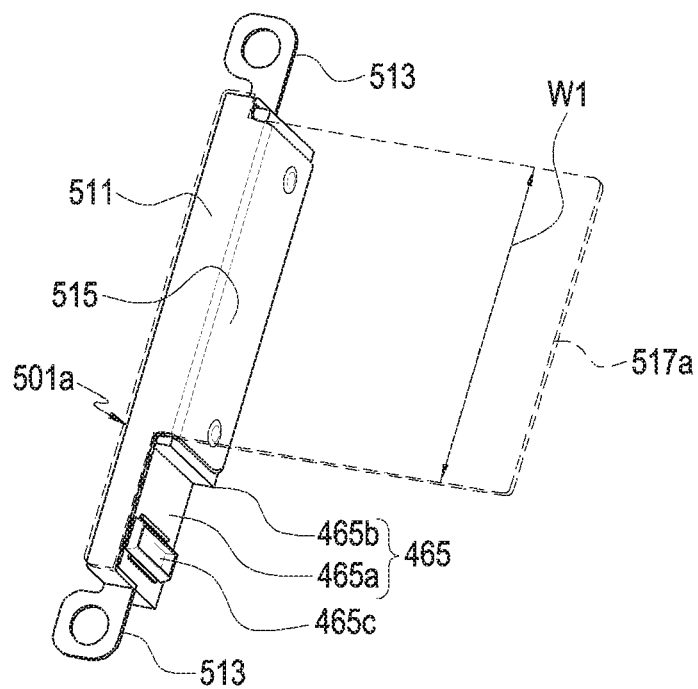
FIG. 11 is a perspective view illustrating a state in which an antenna module and a fixing member of an electronic device according to an embodiment of the disclosure.

FIG. 11 is a perspective view illustrating a state of an antenna module or a fixing member of an electronic device according to an embodiment of the disclosure.

Figure 12:
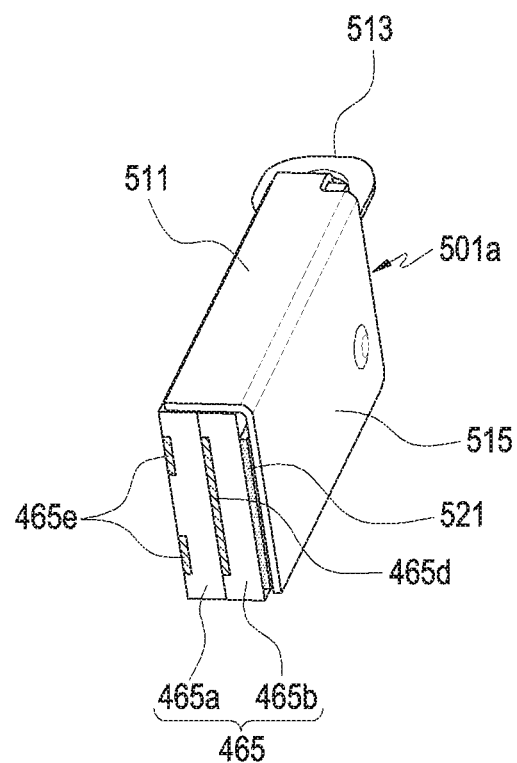
FIG. 12 is a perspective view illustrating an antenna module or a fixing member of an electronic device, in which the antenna module or the fixing member is partially cut, according to an embodiment of the disclosure.

FIG. 12 is a perspective view illustrating an antenna module or a fixing member of an electronic device, in which the antenna module or the fixing member is partially cut, according to an embodiment of the disclosure.

Referring to FIGS. 10 to 12, the antenna module 465 may include a substrate 465*a* and a molding portion 465*b* formed on one face (e.g., the rear face) of the substrate 465*a*. The substrate 465 may include an antenna array including a plurality of conductive patches 465*e* disposed on the other face (e.g., the front face), and an integrated circuit chip 465d configured to transmit/receive a wireless signal using the conductive patches 465e may be mounted on the rear face of the substrate 465a. The molding portion 465b may surround the integrated circuit chip 465d so as to protect the integrated circuit chip 465d from the external environment. In an embodiment of the disclosure, the integrated circuit chip 465d or the conductive patches 465e may generate heat in the operation of transmitting/receiving a wireless signal.

According to various embodiments of the disclosure, even if the molding portion 465b is formed, some areas of the rear face of the substrate 465a may be in the exposed state. In an embodiment of the disclosure, a connector 465c may be disposed in the exposed area of the rear face of the substrate 465a. The connector 465c may provide means for connecting the antenna module 465 to another antenna module or a main PCB (e.g., the main PCB 471 in FIG. 7). For example, the conductive line 481 (e.g., a coaxial cable or an FPCB) in FIG. 7 may be electrically or mechanically connected to the connector 465c.

According to various embodiments of the disclosure, the fixing member 501a may include a fixing piece 511, a fastening piece 513, a first heat transfer portion 515, and/or a second heat transfer portion 517a. In an embodiment of the disclosure, the fixing member 501a is made of a thermally conductive material, whereby the heat generated by the antenna module 465 may be transferred to a heat transfer member or a heat dissipation member (e.g., the heat transfer member 493 or the heat dissipation member 491 in FIG. 4). For example, the heat generated by the antenna module 465 may be dispersed or released to a wider area or space through the fixing member 501a, the heat transfer member 493, or the heat dissipation member 491.

According to various embodiments of the disclosure, the fixing member 501a may be mounted on the side structure 118 in the state of surrounding at least a part of the antenna module 465 (e.g., the side face of the antenna module 465). For example, the fixing piece 511 may be coupled to face the side face of the antenna module 465, and the fastening piece 513 extending from at least one end of the fixing piece 511 may be bound to the side structure 118. In an embodiment of the disclosure, the fastening piece 513 may be bound to the side structure 118 by a fastening member (not illustrated), such as a screw. In an embodiment of the disclosure, the fastening piece 513 may be fixed to be least partially in contact with the conductive material portion 118a of the side structure 118. For example, the heat generated by the antenna module 465 may be transferred to or dissipated towards the side structure 118 through the fastening piece 513.

According to various embodiments of the disclosure, each of the first heat transfer portion 515 and the second heat transfer portion 517a may extend from the fixing piece 511. In embodiment of the disclosure s, the second heat transfer portion 517a may be manufactured separately from the fixing piece 511 and attached to the fixing piece 511. In an embodiment of the disclosure, the first heat transfer portion 515 extends from the fixing piece 511, and may be bent to be inclined (or substantially perpendicular) with respect to the fixing piece 511. For example, when the fixing piece 511 is coupled to and at least partially surrounds the side face of the antenna module 465, the first heat transfer portion 515 may be disposed to at least partially surround or to be in contact with the rear face of the antenna module 465 (e.g., the molding portion 465b). By being disposed adjacent to or substantially in contact with the molding portion 465b, the first heat transfer portion 515 (e.g., the fixing member 501a) may absorb the heat generated by the antenna module 465.

According to various embodiments of the disclosure, an electronic device 500 (e.g., the electronic device 400 in FIG. 4) may further include an adhesive member 521. The adhesive member 521 may be used to attach the first heat transfer portion 515 to one face of the antenna module 465 (e.g., the molding portion 465b), and may transfer heat from the antenna module 465 to the first heat transfer portion 515. For example, the first heat transfer portion 515 may be attached to the molding portion 465b via the adhesive member 521 so as to absorb the heat generated by the antenna module 465.

According to various embodiments of the disclosure, the second heat transfer portion 517a may transfer the heat absorbed by the first heat transfer portion 515 to the heat dissipation member 491 or to the heat transfer member 493. For example, the second heat transfer portion 517a may extend from the fixing piece 511 or the first heat transfer portion 515, or may come into contact with the fixing piece 511 or the first heat transfer portion 515. The heat absorbed by the first heat transfer portion 515 may be dissipated towards the second heat transfer portion 517a. According to an embodiment of the disclosure, the second heat transfer portion 517a may be disposed to at least partially overlap the heat dissipation member 491 or the heat transfer member 493, thereby transferring heat from the antenna module 465 or the first heat transfer portion 515 to the heat dissipation member 491.

Referring to FIGS. 8 and 9 again, the heat dissipation member 491 or the heat transfer member 493 may come into contact with or may be attached to at least a part of the fixing member 501a, for example, the fixing piece 511 and/or the second heat transfer portion 517a. In an embodiment of the disclosure, the heat transfer member 493 is substantially a portion of the heat dissipation member 491 and protrudes from one edge of the heat dissipation member 491, and may be at least partially attached to the second heat transfer portion 517a or the fixing piece 511. For example, the fixing member 501, the heat transfer member 493, or the heat dissipation member 491 may substantially disperse the heat generated by the antenna module 465 to another area or space. In an embodiment of the disclosure, as the heat is dissipated into a wider area or space (e.g., the heat dissipation member), the heat can be released faster than when concentrated in a narrow area (e.g., the antenna module).

According to various embodiments of the disclosure, when the second heat transfer portion 517a has a size or shape sufficient to overlap the heat dissipation member 491, the heat transfer member 493 may be omitted. In an embodiment of the disclosure, when the heat dissipation member 491 or the heat transfer member 493 has a size or shape sufficient to overlap the fixing member 501a (e.g., the fixing piece 511), the second heat transfer portion 517a may be omitted. In an embodiment of the disclosure, by disposing the second heat transfer part 517a, the heat transfer efficiency between the fixing member 501a and the heat dissipation member 491 may be increased. For example, by disposing the second heat transfer part 517a, the overlapping area between the heat dissipation member 491 (or the heat transfer member 493) and the fixing member 501a may be widened. As the overlapping area or the heat transfer area increases, heat may be more quickly dissipated from the fixing member 501a (or the antenna module 465) to the heat dissipation member 491.

According to various embodiments of the disclosure, within the accommodation hole 118c, the antenna module 465 may be disposed to face the nonconductive material portion 118b. For example, the conductive patches 465e may transmit/receive a wireless signal by forming a directional beam via the nonconductive material portion 118b to the external space. In some embodiments of the disclosure, when the antenna module 465 includes a dipole antenna array, another directional beam may be formed in the direction in which the second plate or the rear plate 111 faces.

Figure 13:
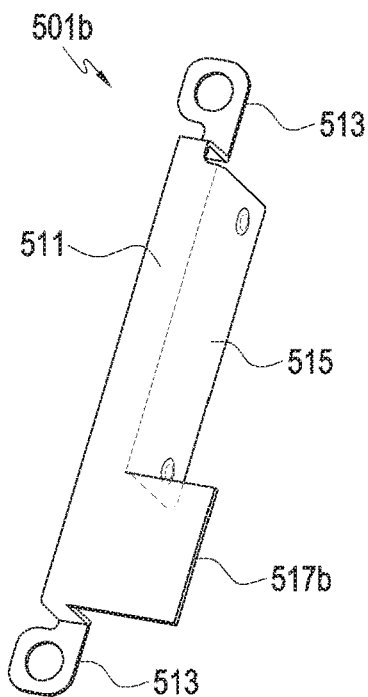
FIG. 13 is a perspective view illustrating a modification of a fixing member of an electronic device according to an embodiment of the disclosure.

FIG. 13 is a perspective view illustrating a modification of a fixing member of an electronic device according to an embodiment of the disclosure.

Figure 14:
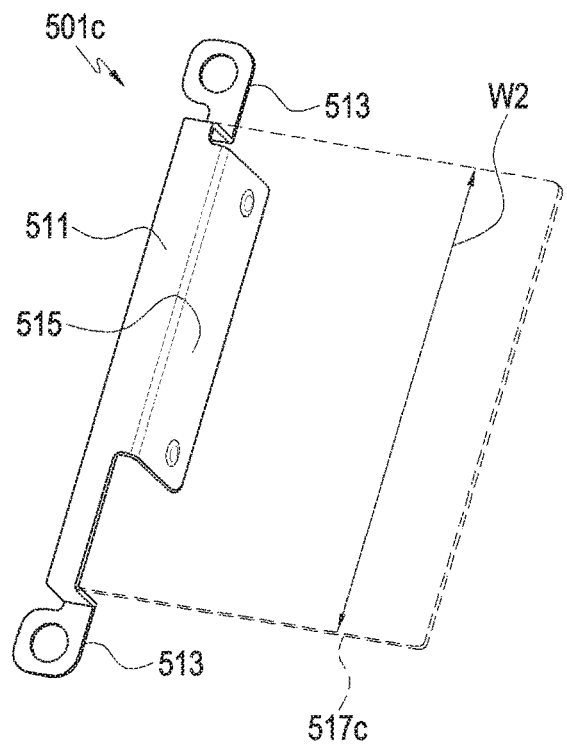
FIG. 14 is a perspective view illustrating a modification of a fixing member of an electronic device according to an embodiment of the disclosure.

FIG. 14 is a perspective view illustrating a modification of a fixing member of an electronic device according to an embodiment of the disclosure.

Referring to FIGS. 13 and 14, when compared with the configuration of FIG. 10, it can be seen that the fixing member 501b or 501c of FIGS. 13 and 14 has a difference in the shape of the second heat transfer portion 517b or 517c.

Referring to FIG. 13, each of the first heat transfer portion 515 or the second heat transfer portion 517a may extend from the fixing piece 511. In an embodiment of the disclosure, the first heat transfer portion 515 may be disposed to be inclined or substantially perpendicular to the fixing piece 511. The second heat transfer portion 517b may be disposed to be inclined or perpendicular relative to the first heat transfer portion 515 while being positioned on substantially the same plane as the fixing piece 511. For example, when the fixing member 501b is manufactured by performing sheet-metal processing on a substantially plate-shaped material, the first heat transfer portion 515 may be formed by bending a portion of the plate-shaped material with respect to the fixing piece 511 or the second heat transfer portion 517b. In an embodiment of the disclosure, the second heat transfer portion 517b may have a size or shape corresponding to the area of the molding portion 465b exposed to the outside on the rear face of the substrate 465a of FIG. 10.

Referring to FIG. 14, in the fixing member 501c, the size or width W2 of the second heat transfer portion 517c is larger than the size or width W1 of the second heat transfer portion 517a in FIG. 11. As the size or width W2 of the second heat transfer portion 517c increases, the contact area between the fixing member 501c and the heat dissipation member 491 (or the heat transfer member 493) may be widened. For example, heat may be more quickly transferred from the fixing member 501c to the heat dissipation member 491.

Figure 15:
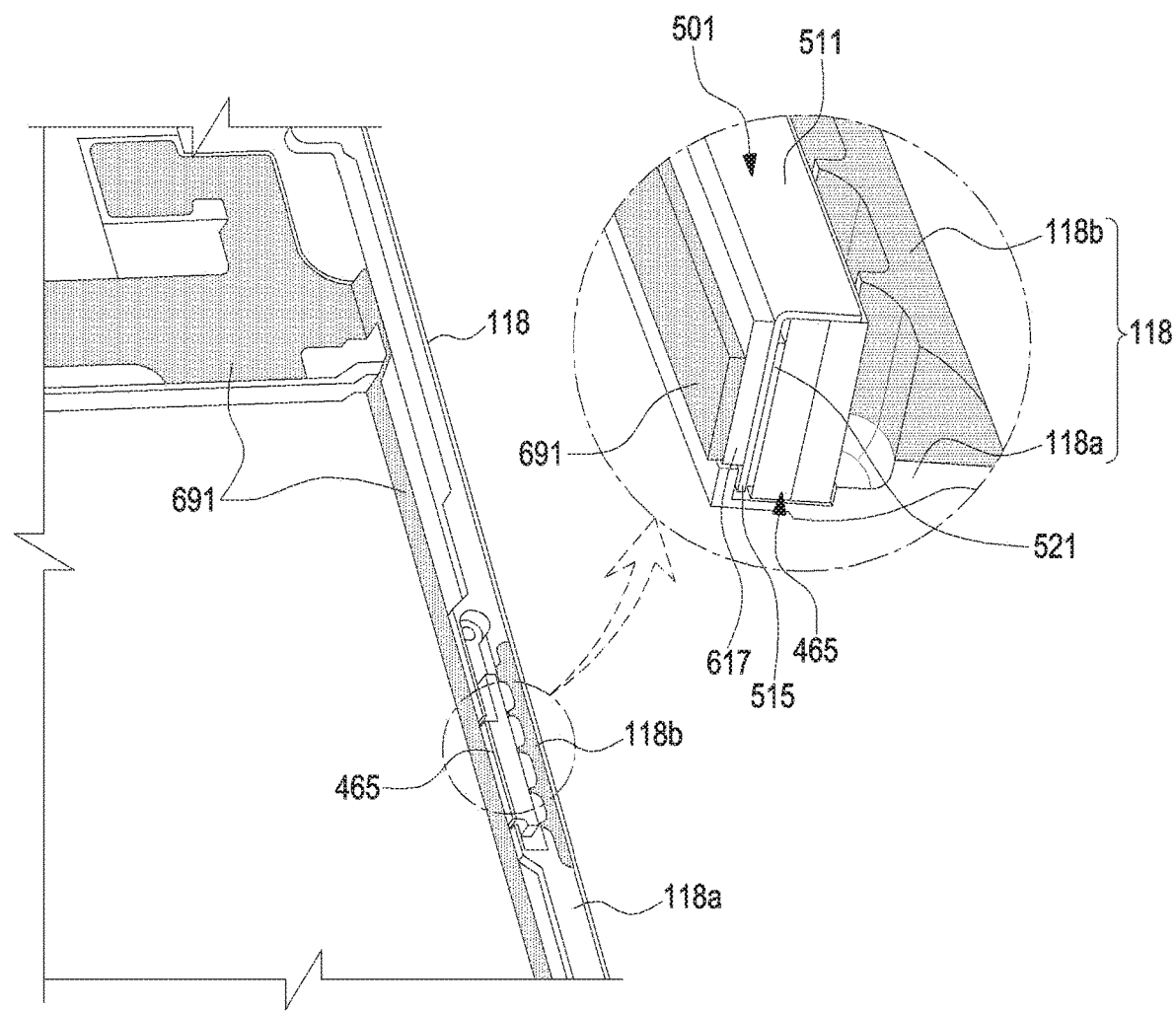
FIG. 15 is a perspective view illustrating a modification of an electronic device according to an embodiment of the disclosure.

FIG. 15 is a perspective view illustrating a modification of an electronic device according to an embodiment of the disclosure.

Referring to FIG. 15, a heat dissipation member 691 of an electronic device (e.g., the electronic device 100, 300, or 400 in FIGS. 1 to 4) may be made of a vapor chamber or a heat pipe, and at least a part of the heat dissipation member 691 may be substantially parallel to the antenna module 465. In an embodiment of the disclosure, at least a part of the heat dissipation member 691 may be disposed to face the first heat transfer portion (e.g., the first heat transfer portion 515 in FIG. 10) of the fixing member 501 at the rear side of the antenna module 465. In some embodiments of the disclosure, the heat dissipation member 691 may be disposed in direct contact with the first heat transfer portion 515.

According to various embodiments of the disclosure, the second heat transfer portion 617 of the fixing member 501 may be interposed between the heat dissipation member 691 and the first heat transfer portion 515. For example, when one face of the second heat transfer portion 617 is in contact with or is attached to the first heat transfer portion 515 and the other face is in contact with or is attached to the heat dissipation member 691, the heat adsorbed by the first heat transfer 515 may be transferred to the heat dissipation member 691 through the second heat transfer portion 617.

Figure 16:
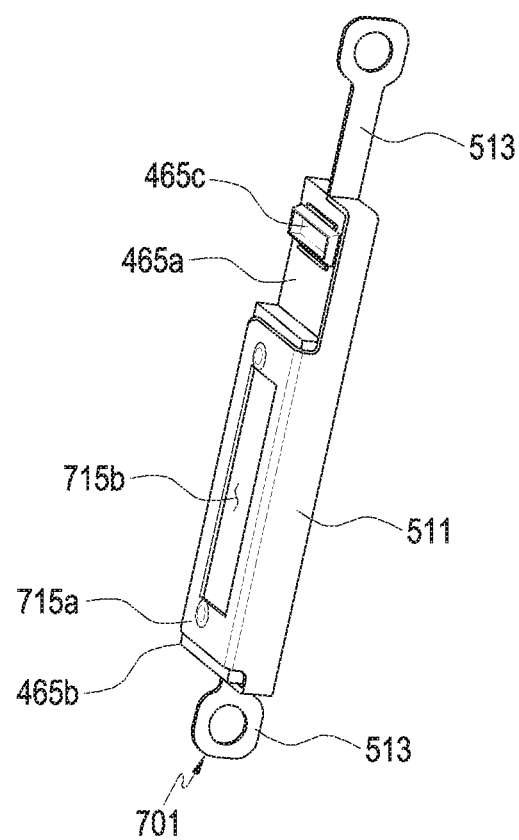
FIG. 16 is a view illustrating a modification of an electronic device according to an embodiment of the disclosure.
Figure 17:
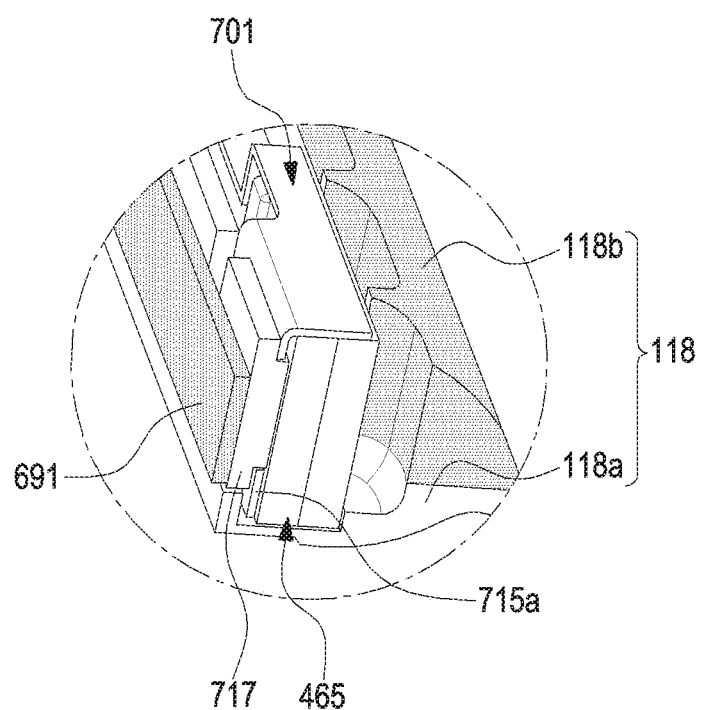
FIG. 17 is a view illustrating a modification of an electronic device according to an embodiment of the disclosure.

FIG. 16 is a view illustrating a modification of an electronic device according to an embodiment of the disclosure, and FIG. 17 is a view illustrating a modification of an electronic device according to an embodiment of the disclosure.

Referring to FIGS. 16 and 17, an electronic device (e.g., the electronic device 100, 300, or 400 in FIGS. 1 through 4) or the fixing member 701 may further include an opening 715b. The opening 715b may be formed to penetrate the first heat transfer portion 715a of the fixing member 701. For example, a part of the antenna module 465 (e.g., a part of the molding portion 465b) may be exposed to the rear side of the fixing member 701 through the opening 715b. In an embodiment of the disclosure, a second heat transfer part 717 may be in contact with or may be attached to the heat dissipation member 691 while being substantially interposed between the heat dissipation member 691 and the first heat transfer portion 715a. In an embodiment of the disclosure, a portion of the second heat transfer portion 717 may be in contact with or may be attached to the antenna module 465 through the opening 715b.

According to various embodiments of the disclosure, by being in direct contact with the antenna module 465, the second heat transfer portion 717 may substantially directly absorb the heat generated by the antenna module 465, and may transfer the heat to the heat dissipation member 691. In some embodiments of the disclosure, some of the heat generated by the antenna module 465 may be absorbed by the first heat transfer portion 715a. Another part of the second heat transfer portion 717 may be attached to the first heat transfer portion 715a around the opening 715b. For example, the second heat transfer portion 717 may directly absorb the heat from the antenna module 465, and at the same time, the heat absorbed by the second heat transfer portion 717 may be transferred to the heat dissipation member 691. Since the second heat transfer portion 717 is disposed so as to be in direct contact with the antenna module 465 and the heat dissipation member 691, the heat generated by the antenna module 465 may be more quickly dissipated towards the heat dissipation member 691. For example, in the structure illustrated in FIG. 15, heat is transferred from the antenna module 465 to the heat dissipation member through the adhesive member 521, the first heat transfer portion 515, and the second heat transfer portion 617. In the structure illustrated in FIG. 17, the heat may be more quickly transferred to the heat dissipation member 691 through the second heat transfer portion 717.

Figure 18:
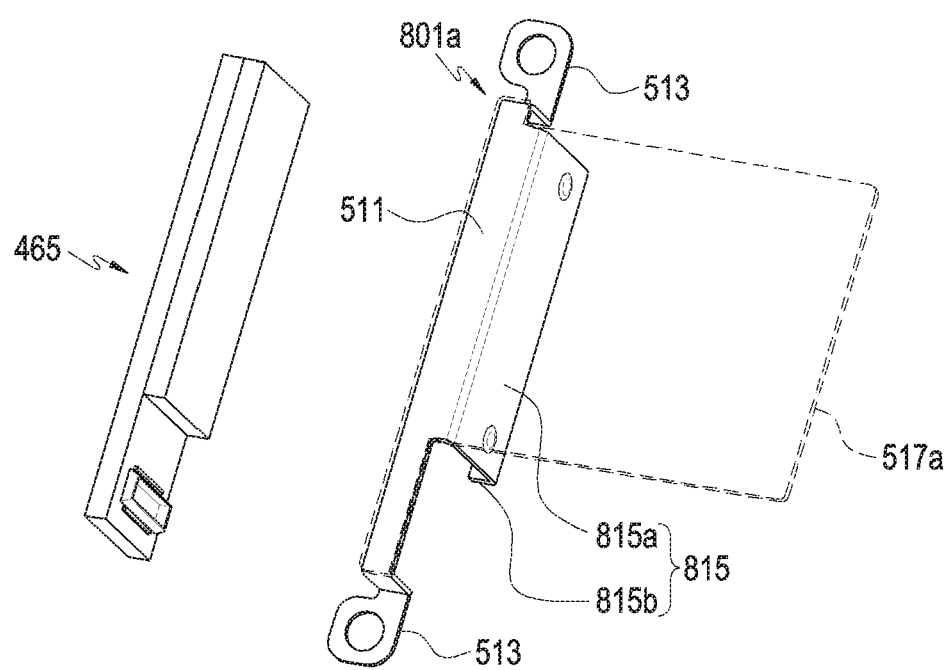
FIG. 18 is an exploded perspective view illustrating a modification of an antenna module or a fixing member of an electronic device according to an embodiment of the disclosure.

FIG. 18 is an exploded perspective view illustrating a modification of an antenna module or a fixing member of an electronic device of an electronic device according to an embodiment of the disclosure.

Figure 19:
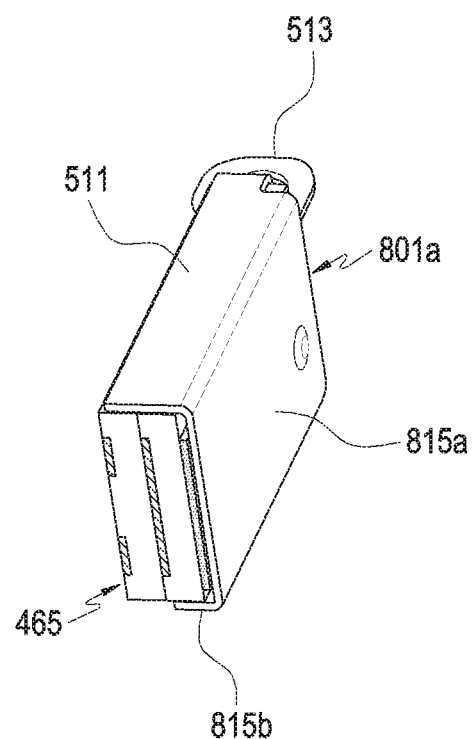
FIG. 19 is a perspective view illustrating a modification of an antenna module or a fixing member of an electronic device, in which the antenna module or the fixing member is partially cut according to an embodiment of the disclosure.

FIG. 19 is a perspective view illustrating a modification of an antenna module or a fixing member of an electronic device, in which the antenna module or the fixing member is partially cut, according to an embodiment of the disclosure.

Figure 20:
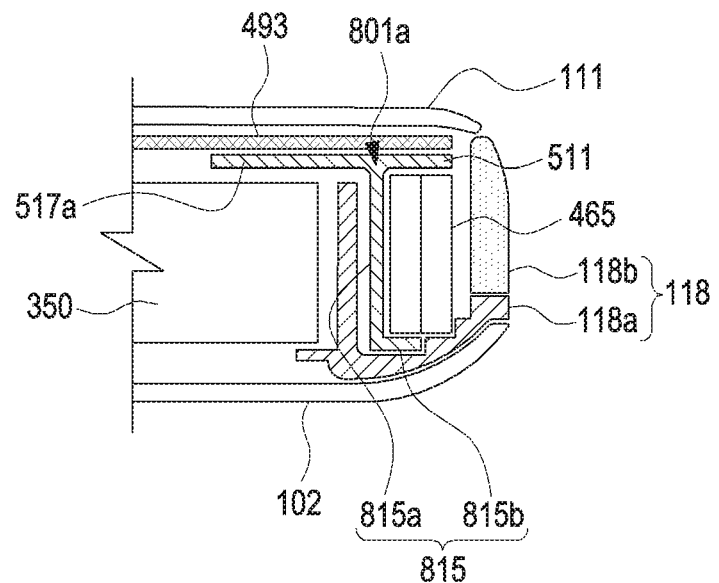
FIG. 20 is a cross-sectional view illustrating a configuration of an electronic device in a state in which an antenna module is mounted through a fixing member of a modification according to an embodiment of the disclosure.

FIG. 20 is a cross-sectional view illustrating a configuration of an electronic device herein in a state in which an antenna module is mounted using a fixing member of a modification according to an embodiment of the disclosure.

Referring to FIGS. 18 to 20, the fixing member 801a may include a first heat transfer portion 815 (e.g., the first heat transfer portion 515 in FIG. 10) provided to at least partially surround the rear face and the side face of the antenna module 465. For example, the first heat transfer portion 815 may include a first portion 815a coupled to face at least a part of the rear face of the antenna module 465 and a second portion 815b extending from the first portion 815a substantially perpendicular thereto. In an embodiment of the disclosure, the second portion 815b may be coupled to and may at least partially surround the side face of the antenna module 465.

According to various embodiments of the disclosure, the first portion 815a and/or the second portion 815b may be coupled to substantially surround at least a part of the antenna module 465 so as to absorb or transfer the heat generated by the antenna module 465 to another structure. For example, when the fixing member 801a or the antenna module 465 is mounted on the side structure 118 (e.g., the side structure 118 in FIG. 4), the second portion 815b may be disposed so as to be in contact with the conductive material portion 118a of the side structure 118. In an embodiment of the disclosure, when the conductive material portion 118a is a thermally conductive material, the second portion 815b may absorb heat from the antenna module 465 and may disperse the heat to the conductive material portion 118a. For example, the second portion 815b may disperse the heat generated by the antenna module 465 to another structure of the electronic device (e.g., the electronic device 400 in FIG. 4).

Since other components of the fixing member 801a (e.g., the fixing piece 511, the fastening piece 513, or the second heat transfer portion 517a) may be similar to those of the fixing member 501a of FIG. 10, descriptions thereof will be omitted.

Figure 21:
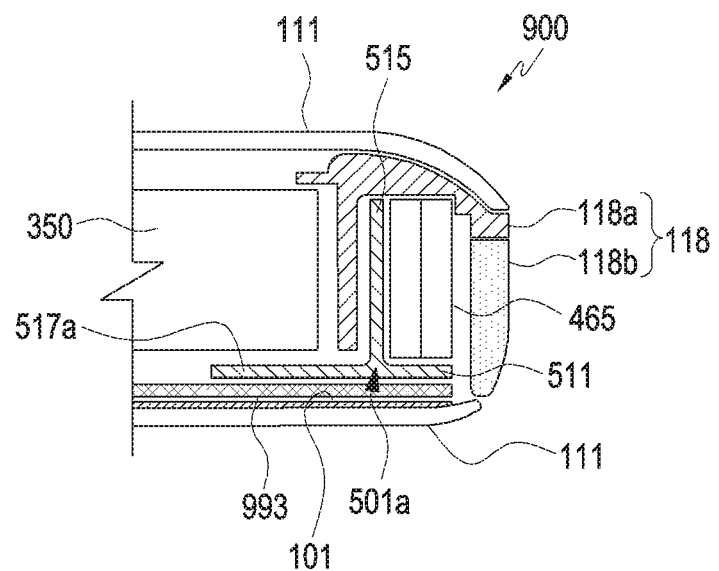
FIG. 21 is a cross-sectional view illustrating a configuration of a modification of an electronic device in a state in which an antenna module is mounted through a fixing member of another modification according to an embodiment of the disclosure.

FIG. 21 is a cross-sectional view illustrating a configuration of an electronic device in which an antenna module is mounted through a fixing member of another modification according to an embodiment of the disclosure.

Referring to FIG. 21, the fixing member 501a may be similar in configuration to the fixing member of FIG. 9. For example, the fixing member 501a may be mounted on or accommodated in the side member 118, and may transmit/receive a wireless signal through the nonconductive material portion 118c of the side member 118. Similar to the embodiment of FIG. 9, the fixing member 501a may include a first heat transfer portion 515 and a second heat transfer portion 517a. In some embodiments of the disclosure, the second heat transfer portion 517a may be disposed adjacent to the front plate 102 (e.g., the front plate 102 in FIG. 1) or the display 101 (e.g., the display 101 in FIG. 1).

According to various embodiments of the disclosure, an electronic device 900 may further include a heat transfer member 993 disposed adjacent to the display 101. For example, the heat transfer member 993 may have a generally flat plate shape, and may absorb the heat generated by the display 101 or other electronic components adjacent to the display 101, or may disperse the heat to other structures. In an embodiment of the disclosure, the second heat transfer portion 571a may be disposed to be in contact with the heat transfer member 993 so as to transfer the heat generated by the antenna module 465 to the heat transfer member 993.

Although FIG. 21 illustrates a structure in which the heat transfer member 993 directly faces the display 101 as an example, the disclosure is not limited thereto. For example, a support member (e.g., the first support member 311 in FIG. 3) may be further disposed between the heat transfer member 993 and the display 101. In an embodiment of the disclosure, the support member disposed between the heat transfer member 993 and the display 101 may absorb the heat generated by the display 101, and may transfer the heat to the heat transfer member 993. In an embodiment of the disclosure, the heat transfer member 993 may be disposed between a support member (e.g., the first support member 311 in FIG. 3) and the display 101. For example, the heat transfer member 993 may absorb the heat generated by the display 101, and may transfer the heat to the support member. In the structure in which the heat transfer member 993 is disposed between the support member and the display 101, the second heat transfer portion 517a may be disposed in contact with the support member so as to transfer or disperse the heat generated by the antenna module 465.

Since other components or arrangement structures of the fixing member 501a may be similar to those of the fixing member 501a in FIG. 9, a description thereof will be omitted. For example, when the fixing member 501a in FIG. 9 is disposed in the state in which the second heat transfer portion 517a is disposed adjacent to the rear plate 111, the fixing member 501a in FIG. 21 may be mounted in the state in which the second heat transfer portion 517a is located adjacent to the display 101 (or the first support member 311 in FIG. 3) while having a shape similar to that of the fixing member 501a in FIG. 9.

Figure 22:
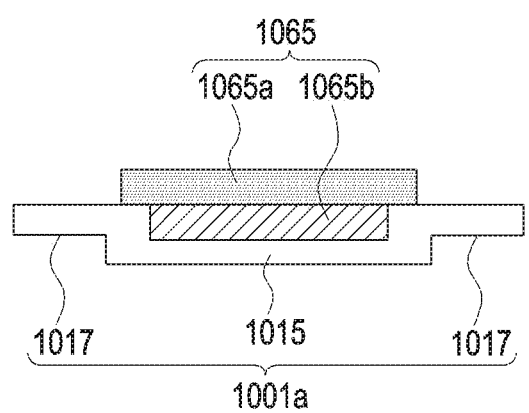
FIG. 22 is a cross-sectional view illustrating a configuration of a modification of an antenna module or a fixing member of an electronic device according to an embodiment of the disclosure.

FIG. 22 is a cross-sectional view illustrating a configuration of a modification of an antenna module or a fixing member of an electronic device according to an embodiment of the disclosure.

In an electronic device according to various embodiments disclosed herein, an antenna module (e.g., the second antenna module 463 in FIG. 4) may perform radiation in a direction in which a rear plate (e.g., the second plate 111 in FIG. 6) or a front plate (e.g., the first plate 102 in FIG. 6) faces.

Referring to FIG. 22, the fixing member 1001a may include a first heat transfer portion 1015 surrounding at least a part of an antenna module 1065, for example, a molding portion 1065b, and a second heat transfer portion 1017 extending from the first heat transfer portion 1015. The second heat transfer portion 1017 may extend substantially parallel to, for example, a substrate 1065a of the antenna module 1065. In an embodiment of the disclosure, the first heat transfer portion 1015 and the second heat transfer portion 1017 have a single flat plate shape, and the first heat transfer portion 1015 may include a recessed structure capable of accommodating the antenna module 1065 (e.g., the molding portion 1065b).

According to various embodiments of the disclosure, the second heat transfer portion 1017 may be mounted or fixed in the state of facing another structure, for example, the PCB 340, the second support member 360, or the rear plate 380 in FIG. 3. In an embodiment of the disclosure, the first heat transfer portion 1015 and/or the second heat transfer portion 1017 may be made of a heat-conductive material so as to absorb or transfer heat. For example, the heat generated by the antenna module 1065 may be dispersed to another structure (e.g., the PCB 340, the second support member 360, or the rear plate 380 in FIG. 3) through the first heat transfer portion 1015 or the second heat transfer portion 1017. When the heat generated by the antenna module 1065 is concentrated in the antenna module 1065, the performance or power efficiency of the antenna module 1065 may be deteriorated. However, an electronic device according to various embodiments (e.g., the electronic device 100, 300, or 400 in FIGS. 1 to 4) may disperse the heat generated by the antenna module 1065 using the fixing member 1001a. For example, by quickly dispersing or releasing at least the heat generated by the antenna module 1065, the antenna module 1065 may be provided with a stable operating environment.

As described above, according to various embodiments disclosed herein, an electronic device (e.g., the electronic device 100, 300, 400, or 500 in FIGS. 1 to 4 or FIG. 8) may include: a housing (e.g., the housing 110 in FIG. 1) including a front plate (e.g., the first plate or the front plate 102 in FIG. 1 or FIG. 9), a rear plate (e.g., the second plate or the rear plate 111 in FIG. 1 or FIG. 9) facing away from the front plate, and a side structure (e.g., the side structure 118 in FIG. 1 or FIG. 9) surrounding the space between the front plate and the rear plate; a heat dissipation member (e.g., the heat dissipation member 491 or 691 in FIG. 4, FIG. 8, or FIG. 15) accommodated inside the housing; at least one antenna module (the antenna module 465 in FIGS. 8 to 12) disposed adjacent to the side structure or at least partially accommodated in the side structure, the antenna module being disposed to be inclined or perpendicular relative to the front plate or the rear plate; and a fixing member (e.g., the fixing member 501a in FIGS. 8 to 12) coupled to and at least partially surrounding the antenna module. The fixing member may include: a first heat transfer portion (e.g., the first heat transfer portion 515 in FIG. 9) at least partially surrounding a rear face of the antenna module; and a second heat transfer portion (e.g., the second heat transfer portion 517a in FIG. 9) disposed in contact with the heat dissipation member, the second heat transfer portion being configured to transfer heat from the first heat transfer portion to the heat dissipation member.

According to various embodiments of the disclosure, the antenna module may include a substrate (e.g., the substrate 465a in FIG. 10) and a molding portion (e.g., the molding portion 465b) formed on one face of the substrate, and the one face of the substrate or another face of the substrate facing away from the one face may be disposed to be inclined or perpendicular relative to the front plate or the rear plate.

According to various embodiments of the disclosure, the first heat transfer portion may be disposed in contact with at least a part of the molding portion.

According to various embodiments of the disclosure, the heat dissipation member may include a graphite sheet, a vapor chamber, or a heat pipe.

According to various embodiments of the disclosure, the fixing member may further include a fixing piece (e.g., the fixing piece 511 in FIG. 10) at least partially surrounding a side face of the antenna module, and the first heat transfer portion or the second heat transfer portion extends from the fixing piece.

According to various embodiments of the disclosure, the fixing member may further include at least one fastening piece (e.g., the fastening piece 513 in FIG. 10) extending from at least one end of the fixing piece, and the fastening piece may be bound to the side structure.

According to various embodiments of the disclosure, the fastening piece may transfer heat from the first heat transfer portion or the fixing piece to the side structure.

According to various embodiments of the disclosure, the electronic device may further include a heat transfer member (e.g., the heat transfer member 493 in FIG. 4 or FIG. 8), in which a portion of the heat transfer member is attached to the fixing piece and another portion of the heat transfer member is attached to the heat dissipation member.

According to various embodiments of the disclosure, the first heat transfer portion may be bent to be inclined or perpendicular relative to the fixing piece and disposed to face or to be in contact with one face of the antenna module.

According to various embodiments of the disclosure, at least a part of the heat dissipation member may be disposed to face the first heat transfer portion, and the second heat transfer portion may be interposed between the heat dissipation member and the first heat transfer portion.

According to various embodiments of the disclosure, the fixing member may further include an opening (e.g., the opening 715b in FIG. 16) formed to penetrate the first heat transfer portion, at least a part of the heat dissipation member may be disposed to face the first heat transfer portion, and the second heat transfer portion (e.g., the second heat transfer portion 717 in FIG. 16) may partially come into contact with one face of the antenna module through the opening while being interposed between the heat dissipation member and the first heat transfer portion.

According to various embodiments of the disclosure, the electronic device may further include an adhesive member (e.g., the adhesive member 521 in FIG. 12), and the adhesive member may be used to attach the first heat transfer portion to one face of the antenna module and to transfer heat from the antenna module to the first heat transfer portion.

According to various embodiments of the disclosure, the side structure may include a conductive material portion (e.g., the conductive material portion 118a in FIG. 8) and a nonconductive material portion (e.g., the nonconductive material portion 118b in FIG. 8), and the antenna module may be disposed to face the nonconductive material portion inside the side structure.

According to various embodiments of the disclosure, the fixing member may further include a fixing piece at least partially surrounding a side face of the antenna module and a fastening piece extending from each end of the fixing piece, and the fastening piece may be bound to the conductive material portion so as to transfer heat from the first heat transfer portion or the fixing piece to the conductive material portion.

According to various embodiments of the disclosure, the fixing member may further include a fixing piece at least partially surrounding a side face of the antenna module, the first heat transfer portion may be disposed to be inclined or perpendicular relative to the fixing piece while extending from the fixing piece, and the second heat transfer portion may be disposed to be inclined or perpendicular relative to the first heat transfer portion while extending from the fixing piece.

According to various embodiments of the disclosure, an electronic device may include: a housing; a display device mounted on one face of the housing; at least one antenna module accommodated inside the housing, the antenna module being configured to transmit/receive a wireless signal by forming a beam in a direction inclined or perpendicular relative to a direction in which a screen is output from the display; a fixing member coupled to and at least partially surrounding the antenna module; and a heat dissipation member accommodated inside the housing. The fixing member may include: a first heat transfer portion at least partially surrounding a rear face of the antenna module; and a second heat transfer portion disposed so as to be in contact with the heat dissipation member, the second heat transfer portion being configured to transfer heat from the first heat transfer portion to the heat dissipation member.

According to various embodiments of the disclosure, the fixing member may further include a fixing piece at least partially surrounding a side face of the antenna module, the first heat transfer portion may be disposed to be inclined or perpendicular relative to the fixing piece while extending from the fixing piece, and the second heat transfer portion may be disposed to be inclined or perpendicular relative to the first heat transfer portion while extending from the fixing piece.

According to various embodiments of the disclosure, the first heat transfer portion may be disposed to face or to come into contact with at least a part of one face of the antenna module.

According to various embodiments of the disclosure, the electronic device may further include a heat transfer member, in which a portion of the heat transfer member may be attached to the fixing piece and another portion of the heat transfer member may be attached to the heat dissipation member.

According to various embodiments of the disclosure, another portion of the heat transfer member may be attached to the second heat transfer portion.

According to various embodiments of the disclosure, the first heat transfer portion is disposed in contact with at least a part of the molding portion.

According to various embodiments of the disclosure, the heat dissipation member includes a graphite sheet, a vapor chamber, or a heat pipe.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
  a housing including a front plate, a rear plate facing away from the front plate, and a side structure surrounding a space between the front plate and the rear plate;
  a heat dissipation member accommodated inside the housing;
  at least one antenna device disposed adjacent to the side structure or at least partially accommodated in the side structure, the at least one antenna device being disposed to be inclined or perpendicular relative to the front plate or the rear plate; and
  a fixing member coupled to and at least partially surrounding the at least one antenna device,
  wherein the fixing member includes:
    a fixing piece at least partially surrounding a side face of the at least one antenna device;
    a first heat transfer portion at least partially surrounding a rear face of the at least one antenna device; and
    a second heat transfer portion disposed in contact with the heat dissipation member, the second heat transfer portion being configured to transfer heat from the first heat transfer portion to the heat dissipation member, and
  wherein the first heat transfer portion or the second heat transfer portion extends from the fixing piece.

2. The electronic device of claim 1,
  wherein the at least one antenna device includes a substrate and a molding portion formed on one face of the substrate, and
  wherein the one face of the substrate or another face of the substrate facing away from the one face is disposed to be inclined or perpendicular relative to the front plate or the rear plate.

3. The electronic device of claim 2, wherein the first heat transfer portion is disposed in contact with at least a part of the molding portion.

4. The electronic device of claim 1, wherein the heat dissipation member includes a graphite sheet, a vapor chamber, or a heat pipe.

5. The electronic device of claim 1,
  wherein the fixing member further includes at least one fastening piece extending from at least one end of the fixing piece, and
  wherein the at least one fastening piece is bound to the side structure.

6. The electronic device of claim 5, wherein the at least one fastening piece transfers heat from the first heat transfer portion or the fixing piece to the side structure.

7. The electronic device of claim 1, further comprising:
  a heat transfer member,
  wherein a portion of the heat transfer member is attached to the fixing piece, and another portion of the heat transfer member is attached to the heat dissipation member.

8. The electronic device of claim 1, wherein the first heat transfer portion is bent to be inclined or perpendicular relative to the fixing piece and is disposed to face or to be in contact with one face of the at least one antenna device.

9. The electronic device of claim 8,
  wherein at least a part of the heat dissipation member is disposed to face the first heat transfer portion, and
  wherein the second heat transfer portion is interposed between the heat dissipation member and the first heat transfer portion.

10. The electronic device of claim 8,
  wherein the fixing member further includes an opening formed to penetrate the first heat transfer portion,
  wherein at least a part of the heat dissipation member is disposed to face the first heat transfer portion, and
  wherein the second heat transfer portion partially comes into contact with one face of the at least one antenna device through the opening while being interposed between the heat dissipation member and the first heat transfer portion.

11. The electronic device of claim 8, further comprising:
  an adhesive member,
  wherein the adhesive member is used to attach the first heat transfer portion to one face of the at least one antenna device, and transfers heat from the at least one antenna device to the first heat transfer portion.

12. The electronic device of claim 1,
  wherein the side structure includes an electrically conductive material portion and an electrically nonconductive material portion, and
  wherein the at least one antenna device is disposed to face the electrically nonconductive material portion inside the side structure.

13. The electronic device of claim 12,
  wherein the fixing member further includes a fixing piece at least partially surrounding a side face of the at least one antenna device and fastening pieces extending from both ends of the fixing piece, respectively, and
  wherein the fastening pieces are bound to the electrically conductive material portion and are configured to transfer heat from the first heat transfer portion or the fixing piece to the electrically conductive material portion.

14. The electronic device of claim 1,
  wherein the first heat transfer portion is disposed to be inclined or perpendicular relative to the fixing piece while extending from the fixing piece, and
  wherein the second heat transfer portion is disposed to be inclined or perpendicular relative to the first heat transfer portion while extending from the fixing piece.

15. An electronic device comprising:

a housing;

a display device mounted on one face of the housing;

at least one antenna device accommodated inside the housing, the at least one antenna device being configured to transmit/receive a wireless signal by forming a beam in a direction inclined or perpendicular relative to a direction in which the display faces;

a fixing member coupled to and at least partially surrounding the at least one antenna device; and a heat dissipation member accommodated inside the housing, wherein the fixing member includes:

a first heat transfer portion at least partially surrounding a rear face of the at least one antenna device; and a second heat transfer portion disposed in contact with the heat dissipation member, the second heat transfer portion being configured to transfer heat from the first heat transfer portion to the heat dissipation member.

16. The electronic device of claim 15, wherein the fixing member further includes a fixing piece at least partially surrounding a side face of the at least one antenna device, wherein the first heat transfer portion is disposed to be inclined or perpendicular relative to the fixing piece while extending from the fixing piece, and wherein the second heat transfer portion is disposed to be inclined or perpendicular relative to the first heat transfer portion while extending from the fixing piece.

17. The electronic device of claim 16, wherein the first heat transfer portion is disposed to face or to come into contact with at least a part of one face of the at least one antenna device.

18. The electronic device of claim 16, further comprising:

a heat transfer member, wherein a portion of the heat transfer member is attached to the fixing piece, and another portion of the heat transfer member is attached to the heat dissipation member.

19. The electronic device of claim 18, wherein another portion of the heat transfer member is attached to the second heat transfer portion.

* * * * *